United States Patent
Sung (10) Patent No.: US 10,337,687 B2
(45) Date of Patent: Jul. 2, 2019

(54) METAL PCB ASSEMBLY FOR VEHICLE LAMP AND MANUFACTURING METHOD THEREOF

(71) Applicant: SEJONG MATERIALS CO., LTD, Ansan-si, Gyeonggi-do (KR)

(72) Inventor: Jaedeok Sung, Ansan-si (KR)

(73) Assignee: SEJONG MATERIALS CO., LTD, Ansan-si, Gyeonggi-Do (KR)

( * ) Notice: Subject to any disclaimer, the term of this patent is extended or adjusted under 35 U.S.C. 154(b) by 41 days.

(21) Appl. No.: 15/104,299

(22) PCT Filed: Jan. 29, 2016

(86) PCT No.: PCT/KR2016/000998
§ 371 (c)(1),
(2) Date: Jun. 14, 2016

(87) PCT Pub. No.: WO2016/153168
PCT Pub. Date: Sep. 29, 2016

(65) Prior Publication Data
US 2018/0010775 A1 Jan. 11, 2018

(30) Foreign Application Priority Data
Mar. 20, 2015 (KR) .................. 10-2015-0038996

(51) Int. Cl.
*H05K 1/02* (2006.01)
*F21S 43/00* (2018.01)
(Continued)

(52) U.S. Cl.
CPC .............. *F21S 43/00* (2018.01); *F21S 43/14* (2018.01); *F21S 43/15* (2018.01); *F21S 43/19* (2018.01);
(Continued)

(58) Field of Classification Search
CPC .. F21V 19/0015; F21V 19/001; F21V 19/002; F21V 19/0025; F21V 19/005;
(Continued)

(56) References Cited

U.S. PATENT DOCUMENTS

2015/0003083 A1* 1/2015 Uehara ................. H05K 1/056
362/418

FOREIGN PATENT DOCUMENTS

JP 2008-176996 7/2008
KR 10-2009-0054898 6/2009
(Continued)

*Primary Examiner* — Peter Dungba Vo
*Assistant Examiner* — Azm A Parvez
(74) *Attorney, Agent, or Firm* — Kile Park Reed & Houtteman PLLC (57) ABSTRACT

The present invention relates to a manufacturing method of a metal PCB assembly for a vehicle lamp and the metal PCB assembly made by the method. The manufacturing method of a metal PCB assembly for a vehicle lamp comprises a step S100 in which a material of a metal PCB 14 is prepared, a step S110 in which a circuit pattern 22 and a plurality of unit patterns 16 are formed and cut from the material of a metal PCB 14 to form a metal PCB 14, a step S120 in which a bending groove 24 is formed on a bottom surface of the metal PCB 14, a step S130 in which each of the unit patterns 16 is protruded forward around the bending groove 24 of the metal PCB 14 such that each of the unit patterns 16 is bent to be inclined from the metal PCB 14, and a step S140 in which a stepwise injection molded products 12 is coupled with the metal PCB 14 while the unit pattern 16 is protruded.

2 Claims, 11 Drawing Sheets (51) Int. Cl.
*F21V 19/00* (2006.01)
*H05K 3/00* (2006.01)
*H05K 3/04* (2006.01)
*H05K 1/05* (2006.01)
*F21S 43/19* (2018.01)
*F21S 43/14* (2018.01)
*F21S 43/15* (2018.01)
*F21Y 115/10* (2016.01)
*F21Y 107/50* (2016.01)

(52) U.S. Cl.
CPC ........ *F21S 43/195* (2018.01); *F21V 19/0015* (2013.01); *H05K 1/0278* (2013.01); *H05K 1/056* (2013.01); *H05K 3/0044* (2013.01); *H05K 3/041* (2013.01); *F21Y 2107/50* (2016.08); *F21Y 2115/10* (2016.08); *H05K 2201/09036* (2013.01); *H05K 2201/09054* (2013.01); *H05K 2201/10106* (2013.01); *H05K 2201/10409* (2013.01); *H05K 2201/10522* (2013.01); *H05K 2203/0108* (2013.01); *H05K 2203/1327* (2013.01); *H05K 2203/302* (2013.01)

(58) Field of Classification Search
CPC .......... H05K 2201/09036; H05K 2201/09054; H05K 2201/10106; H05K 2201/10409; H05K 2201/10522
USPC ................................ 29/831, 829, 825, 592.1
See application file for complete search history.

(56) References Cited

FOREIGN PATENT DOCUMENTS

| KR | 20140009799 | * | 7/2012 | ............ H01L 29/84 |
|---|---|---|---|---|
| KR | 10-2012-0097802 | | 9/2012 | |
| KR | 10-1191398 | | 10/2012 | |
| KR | 10-1367770 | | 2/2014 | |

* cited by examiner

METAL PCB ASSEMBLY FOR VEHICLE LAMP AND MANUFACTURING METHOD THEREOF

TECHNICAL FIELD

The present invention relates to a metal printed circuit board (PCB) assembly for a vehicle lamp and a manufacturing method thereof and, more specifically, to a metal PCB assembly for a vehicle lamp and a manufacturing method thereof which cut three side surfaces of a unit pattern arranged on a metal circuit board and forming a bending groove on a rear surface of the circuit board, which corresponds to one side surface of the unit pattern, such that the unit pattern is easily bent forward at a predetermined angle from the metal circuit board, and light emitting diode (LED) light is emitted forward.

BACKGROUND ART

In general, a PCB is a circuit board on which electronic devices are mounted and components or signal lines are electrically connected to each other.

The circuit is made by pressing a copper foil on one or both sides of an insulation plate made of an insulation material such as a phenol resin, epoxy resin, etc. forming a conductive pattern on the copper foil, and removing some of the copper film by etching away unnecessary parts.

These circuit boards are classified into a normal circuit board, a carbon carbon circuit board, a metal circuit board, a multilayer circuit board, a Flexible circuit board, etc. according to structures.

In recent years, a problem occurs with a circuit board used with various components as well as LEDs that the circuit board has a low heat radiation effect. Therefore, metal circuit board adopting metal materials such as aluminum or copper alloys, etc. are developed and the metal circuit boards are widely and highly accepted in the market.

In particular, in relation to a demand for a metal circuit board for mounting LEDs, a demand for a metal circuit board for mounting LEDs on which structural formations such as bending, pressing, etc. can be applied rises in recent years.

Figure 1:
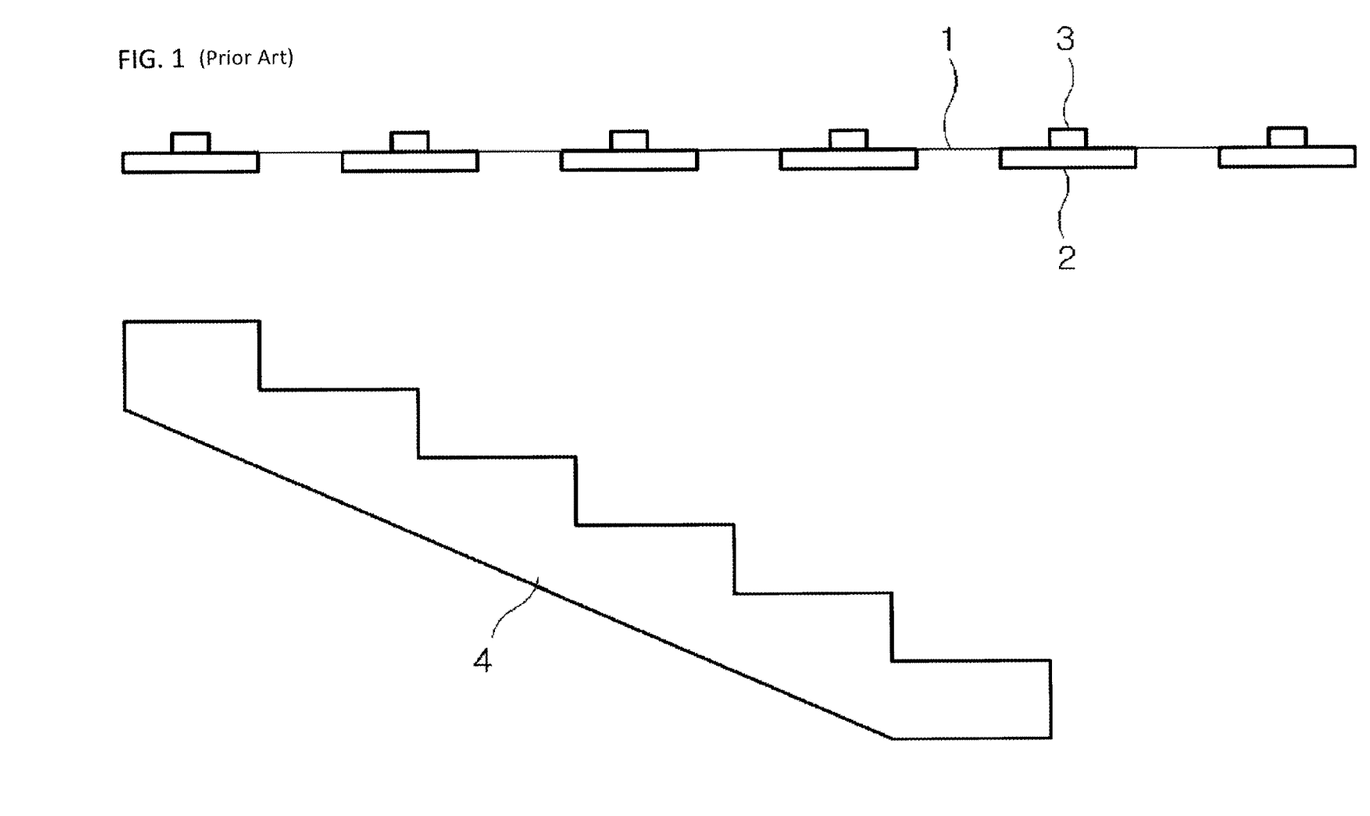
FIG. 1 is a drawing illustrating a light module using a conventional metal flexible PCB and a stepwise plastic injection molded product before they are coupled with each other.
Figure 2:
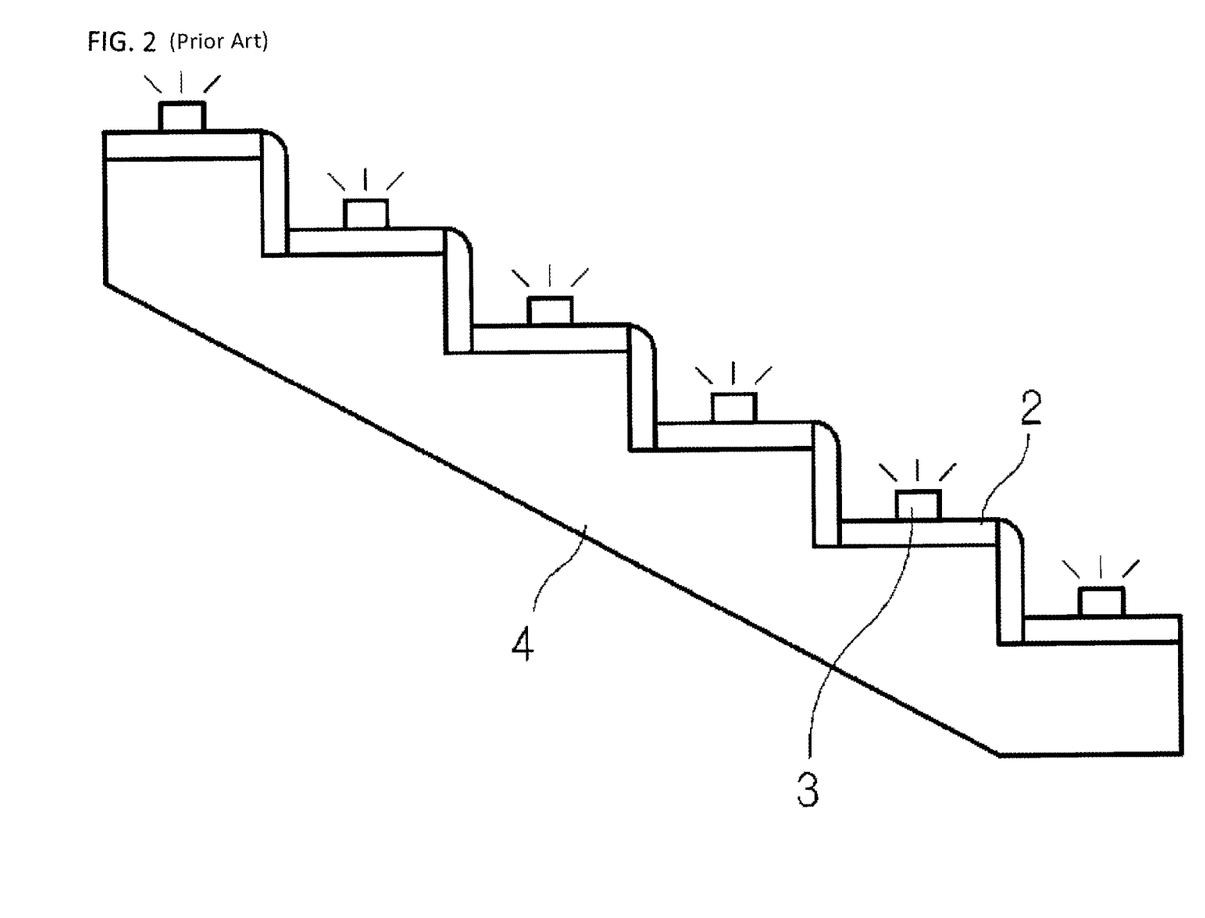
FIG. 2 is a drawing illustrating them after coupling.
Figure 3:
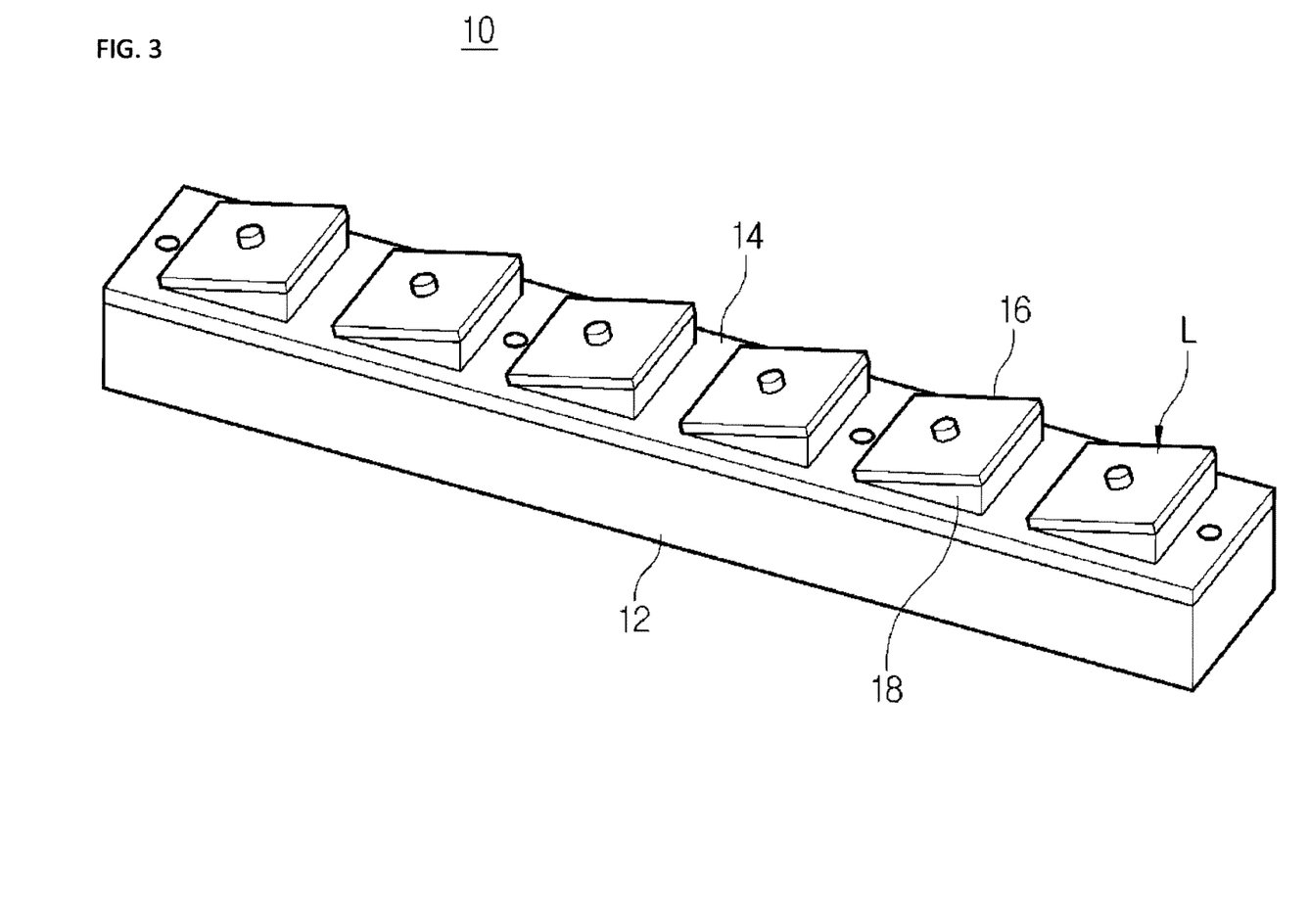
FIG. 3 is a perspective view of a metal PCB assembly for a vehicle lamp according to an embodiment of the present invention.

An LED light module using a metal circuit board is illustrated in FIGS. 1 and 2 as an example of the metal circuit board for mounting LEDs.

In this LED light module, a plurality of aluminum plates 2 are arranged with a constant spacing between them on a rear surface of a metal flexible PCB 1 and the aluminum plates are fixed on the rear surface by a double-sided adhesive film.

And, an LED chip 3 is mounted on an upper surface position of the PCB corresponding to the aluminum plate 2 which is attached to the rear surface of the metal flexible PCB 1, which completes the PCB light module.

When this PCB light module is positioned on a stepwise injection molded product 4, a flexible portion is bent and the aluminum plate 2 is placed on a horizontal portion of the injection molded product 4, such that the PCB light module is placed in a stepwise shape. Therefore, the LED light can be emitted forward.

On the other hand, this conventional PCB light module has the following problems.

First, the conventional PCB light module does not have a structure made only of a metal circuit board, and the aluminum plate is arranged away from the rear surface of the flexible circuit board by a predetermined spacing, which results in a poor heat radiation effect. Therefore, high performance LED chips cannot be used for the PCB light module and this could degrade the brightness of the PCB light module with the LED chips.

Second, since the aluminum plate is attached to the rear surface of the flexible circuit board by a double-sided adhesive tape, a bubble can be generated during a surface mount technology (SMT) process at a temperature of about 300 degrees, which causes failures to occur in products.

Third, since the aluminum plate is attached to the flexible PCB, it takes long to attach the aluminum plate. Also, since the aluminum plate needs to be attached at an accurate position, high accuracy is required, and the high accuracy requirement could make the manufacturing processes complex and raise the manufacturing cost.

DETAILED DESCRIPTION OF THE INVENTION

Technical Problem

The present invention is proposed to solve the aforementioned problems, and an objective of the present invention is to provide a metal PCB assembly for a vehicle lamp whose circuit board is formed only with a metal and to which a bending scheme using a groove machining process is applied such that heat radiation performance of the assembly is improved and a high performance LED can be applied to the assembly. Also, since no tape is used for attaching components, bubbles are not generated during the SMT process, and manufacturing cost of the assembly is reduced.

Technical Solution

In order to accomplish the aforementioned objective of the present invention, an embodiment of the present invention provides a metal PCB assembly comprising:

a metal printed circuit board (PCB) 14;

at least one unit pattern 16 which is arranged on the metal PCB 14 and has three surfaces 20*a*, 20*b*, 20*c* cut from the metal PCB 14 and one rest surface 20*d* connected to the metal PCB 14, wherein the unit pattern 16 is protruded to be inclined at a predetermined angle from the metal PCB 14 by forming a bending groove 24 on a bottom surface of the metal PCB 14, which corresponds to the one rest surface 20*d*, in a width direction to a predetermined depth, and pushing the unit pattern 16 from the metal PCB 14; and an injection molded product 12 which is coupled with the metal PCB 14 and includes a support portion 26 which is protruded from a horizontal plane to support the unit pattern 16 at the predetermined angle from the metal PCB 14.

Another embodiment of the present invention provides a manufacturing method of a metal PCB assembly comprising:

a step S100 in which a material of a metal PCB 14 is prepared;

a step S110 in which a circuit pattern 22 and a plurality of unit patterns 16 are formed and cut from the material of a metal PCB 14 to form a metal PCB 14;

a step S120 in which a bending groove 24 is formed on a bottom surface of the metal PCB 14;

a step S130 in which each of the unit patterns 16 is protruded forward around the bending groove 24 of the metal PCB 14 such that each of the unit patterns 16 is bent to be inclined from the metal PCB 14; and a step S140 in which a stepwise injection molded products 12 is coupled with the metal PCB 14 while the unit pattern 16 is protruded.

Advantageous Effects

The metal PCB assembly for a vehicle lamp and a manufacturing method thereof according to an embodiment of the present invention have the following advantages.

First, since a unit pattern is formed on a metal circuit board, three side surfaces of the unit pattern are cut, and a bending groove is formed on a rear surface of the circuit board to correspond to one side surface, the unit pattern can be pushed forward around the bending groove and the metal PCB assembly can be formed to have a stepwise shape using a small force.

Second, since the circuit board is made only with a metal, heat radiation effect can be enhanced, which results in applicability of high performance LEDs and high brightness.

BEST MODE

In the following, the metal PCB assembly for a vehicle lamp according to an embodiment of the present invention is described in detail by referring to appended drawings.

When referring to FIGS. 3-11, a metal PCB assembly 10 for a vehicle lamp comprises: a metal printed circuit board (PCB) 14; at least one unit pattern 16 which is arranged on the metal PCB 14 and has three surfaces 20a, 20b, 20c cut from the metal PCB 14 and one rest surface 20d connected to the metal PCB 1, such that the unit pattern 16 is protruded to be inclined at a predetermined angle from the metal PCB 14; and an injection molded product 12 which is coupled with the metal PCB 14 and includes a support portion 26 which is protruded from a horizontal plane to support the unit pattern 16 at the predetermined angle from the metal PCB 14.

The metal PCB 14 assembly 10 has such a structure can be manufactured by forming a bending groove 24 with a predetermined depth at a lower surface of the metal PCB 14 and pushing the unit pattern 16 forward around the bending groove 24 to be bent, such that the metal PCB assembly 10 can have a stepwise shape with a small force. Also, since the metal PCB is formed only with a metal, heat radiation effect can be enhanced and high performance LEDs can be applied to the circuit board, which results in high brightness.

Figure 4:
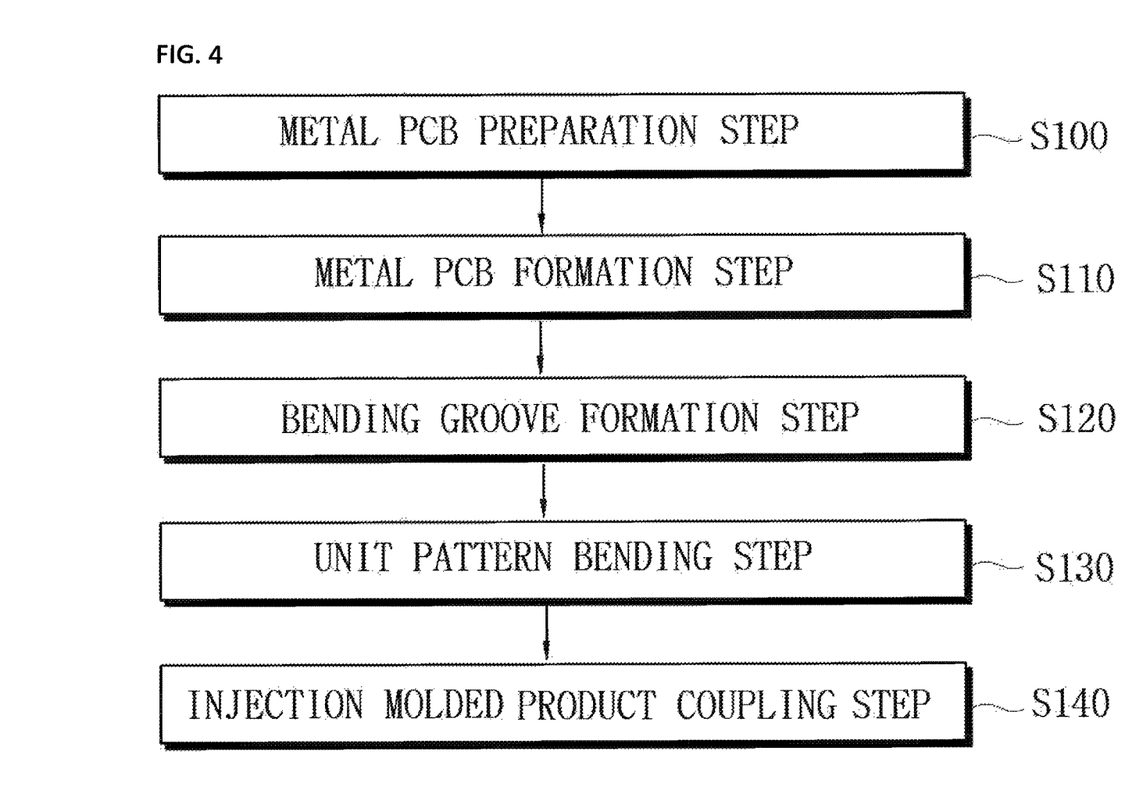
FIG. 4 is a flow chart illustrating a manufacturing method of a metal PCB assembly for a vehicle lamp according to an embodiment of the present invention.

A manufacturing method of such a metal PCB assembly for a vehicle lamp is as follows and comprises: a step S100 in which a material of a metal PCB 14 is prepared; a step S110 in which a circuit pattern 22 and a plurality of unit patterns 16 are formed on the metal PCB 14 and a press process is performed; a step S120 in which a bending groove 24 is formed on a bottom surface of the metal PCB 14; a step S130 in which each of the unit patterns 16 is protruded by pushing forward around the bending groove 24 of the metal PCB 14 such that each of the unit patterns 16 is bent to be inclined from the metal PCB 14; and a step S140 in which a stepwise injection molded products 12 is coupled with the metal PCB 14 while the unit pattern 16 is protruded.

Figure 5:
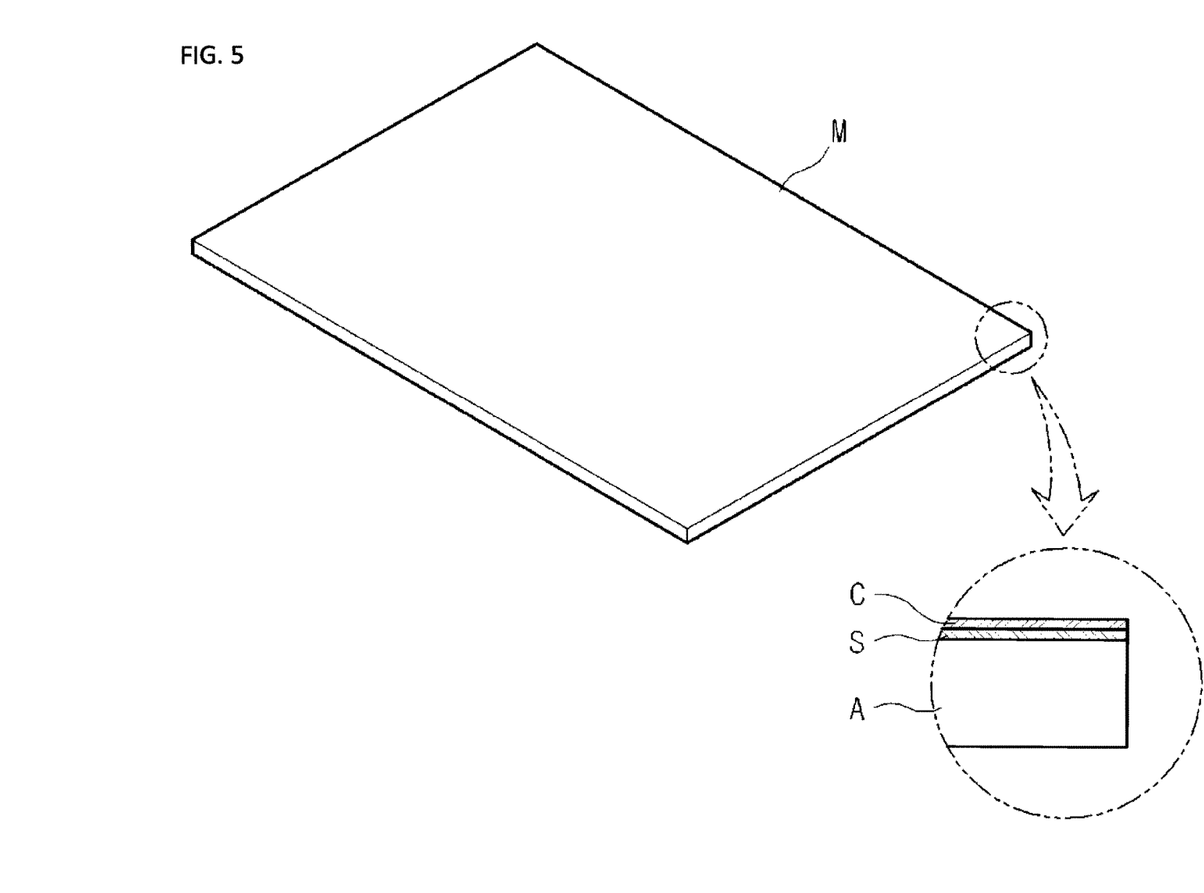
FIG. 5 is a perspective view of a metal copper clad laminate (MCCL) which is an original material for manufacturing the metal PCB assembly for a vehicle lamp shown in FIG. 3.

In the manufacturing method of a metal PCB for a vehicle lamp, at first, a material PCB preparation step S100 for the metal PCB 14 is performed. In step S100, a material for processing the metal PCB 14 is prepared, and, a metal copper clad laminate (MCCL; M), for example, can be used.

This MCCL M is a copper laminate based on metal and used as a material for a PCB. An insulation layer S is formed on an aluminum layer A, and a copper plate C made of copper, etc. is formed on the insulation layer S.

Figure 6:
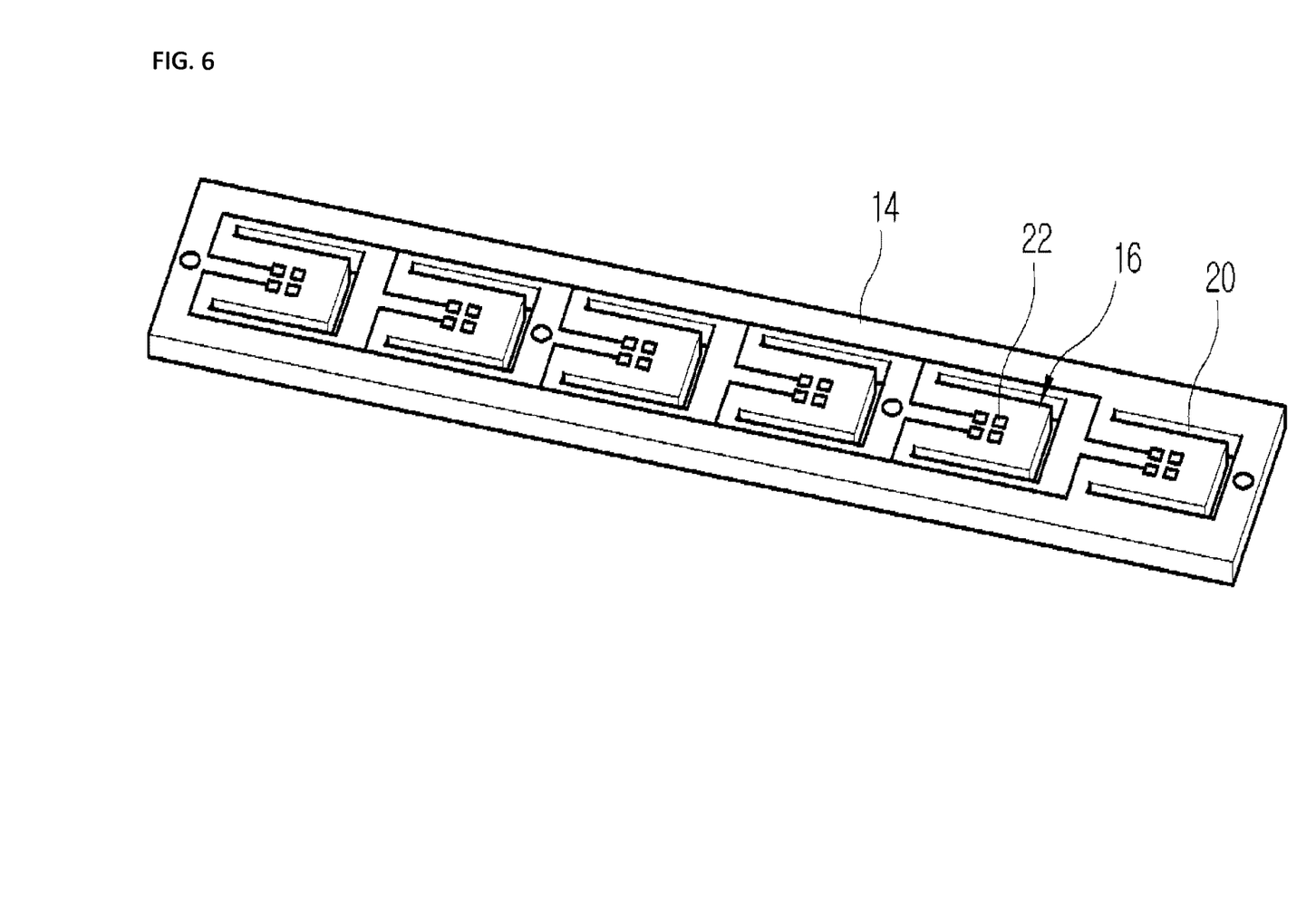
FIG. 6 is a perspective view illustrating a shape after a press process performed on a circuit which is formed on the metal PCB obtained by applying the MCCL in FIG. 5 to the metal PCB.

When the MCCL M is prepared as the material for the metal PCB 14, a metal PCB formation step S110 is performed. In step S110, a circuit pattern 22 and unit patterns 16 are formed on the metal PCB 14.

That is, in step S110, the circuit pattern 22 is formed on the MCCL M by using a process such as etching, etc. In the meantime, the circuit pattern 22 consists of a plurality of unit patterns 16 on which light emitting diodes (LEDs; L) can be mounted. Here, only one set of the circuit pattern 22 can be formed on the MCCL M, and a plurality of sets of circuit patterns 22 can also be formed on the MCCL M.

The MCCL M on which the circuit pattern 22 is formed is cut by a press tool such that the metal PCB 14 is removed from the MCCL M. In the meantime, not only an outer rim of the metal PCB 14 but also three outer surfaces 20a, 20b, 20c of the unit pattern 16 on the circuit pattern 22 are cut.

That is, each of the unit patterns 16 is surrounded by four virtual surfaces on the metal PCB 14, and three surfaces 20a, 20b, 20c of these four surfaces are cut by the press tool.

Therefore, as described in the following, when the unit pattern 16 with three cut surfaces 20a, 20b, 20c is pushed upwards using a tool, etc., only the pushed unit pattern 16 can be protruded from the metal PCB 14.

In the meantime, since one surface 20d of the unit pattern 16 is connected to the metal PCB 14 in one entity, the unit pattern 16 is not completely removed from the metal PCB 14, and it is protruded at a predetermined from the metal PCB 14 with one side connected thereto.

Figure 7:
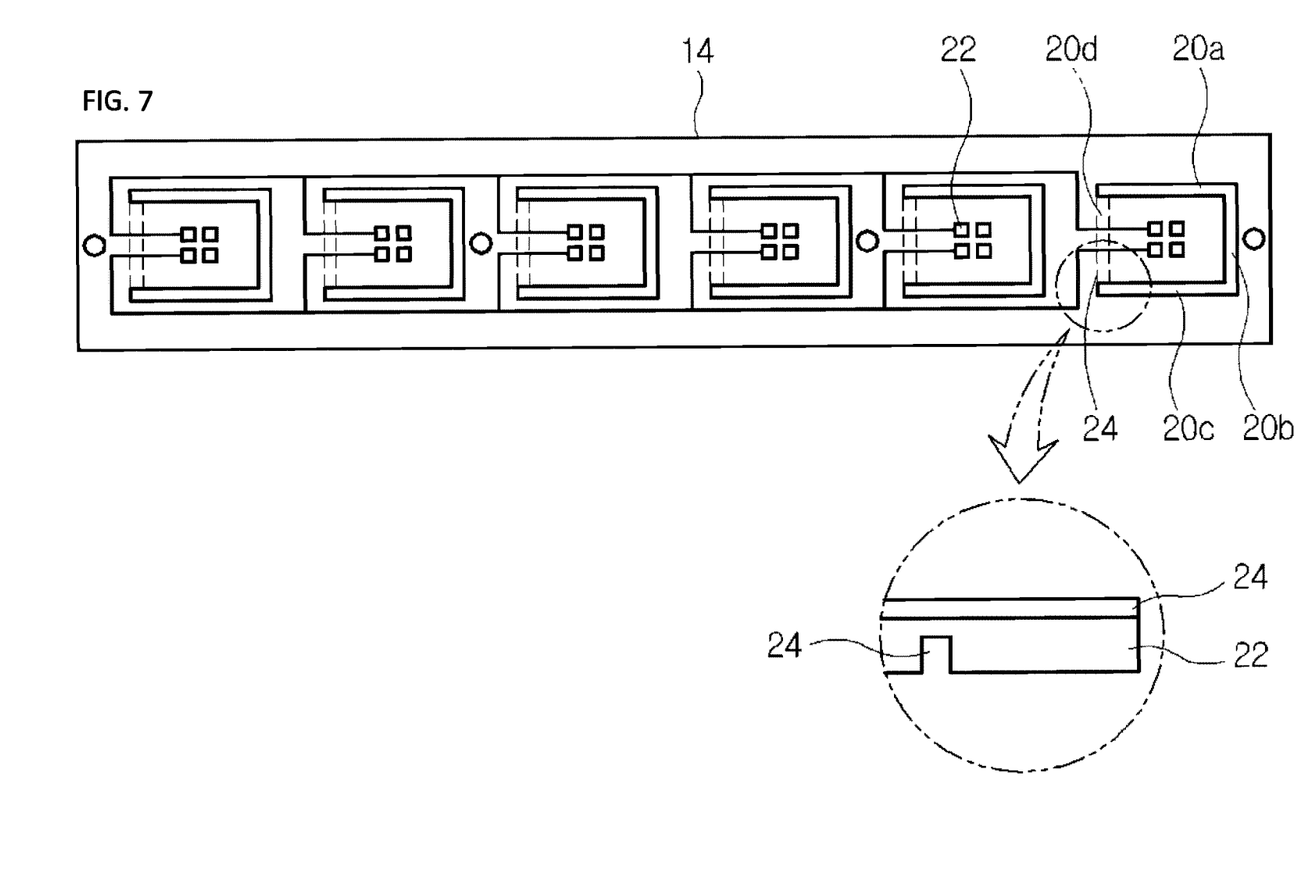
FIG. 7 is an underside view illustrating a bottom surface of the assembly shown in FIG. 6 with a bending groove formed thereon.
Figure 8:
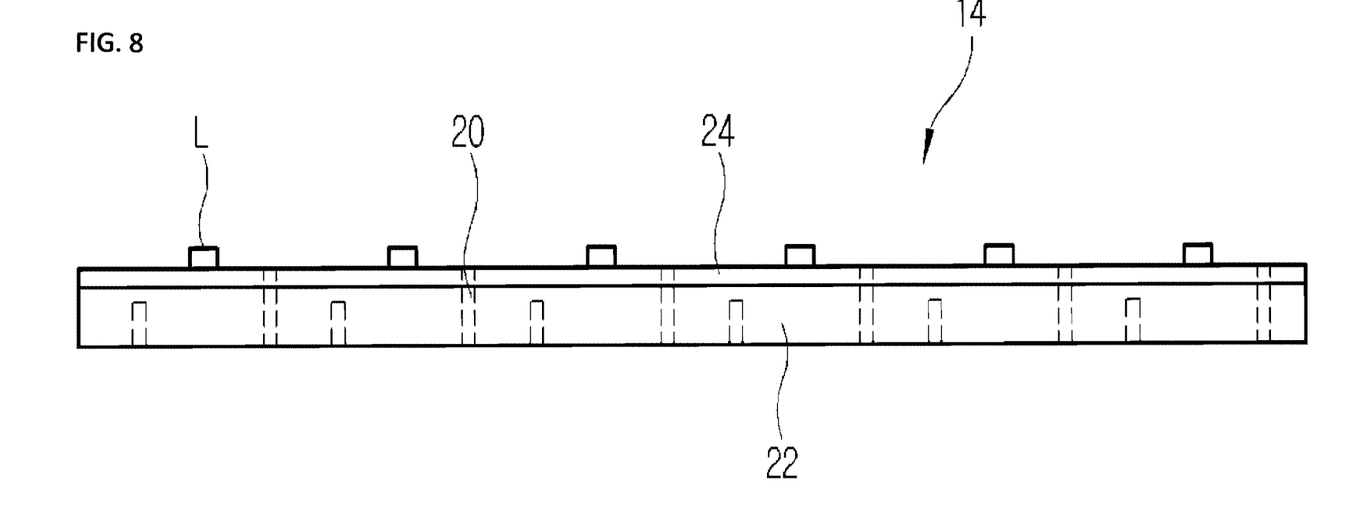
FIG. 8 is a side view of FIG. 7, and it illustrates an LED chip mounted on the metal PCB and the bending groove formed on the bottom surface of the metal PCB.

In the similar manner, after the metal PCB formation step S110 is completed, a step S120 for forming a bending groove 24 at the bottom surface of the metal PCB 14 is performed in order to allow the unit pattern 16 to be protruded forward easily.

That is, since first, second, and third surfaces 20a, 20b, 20c of four surfaces of the unit pattern 16 is cut, the bending groove 24 is processed at a position on the bottom surface of the metal PCB 14 which corresponds to the rest one surface 20d and at positions which connect end portions of the second surface and the third surface 20b, 20c with each other in a width direction.

In the meantime, the bending groove 24 is preferably processed to a depth which allows the unit pattern 16 of the metal PCB 14 to be easily bent.

Figure 9:
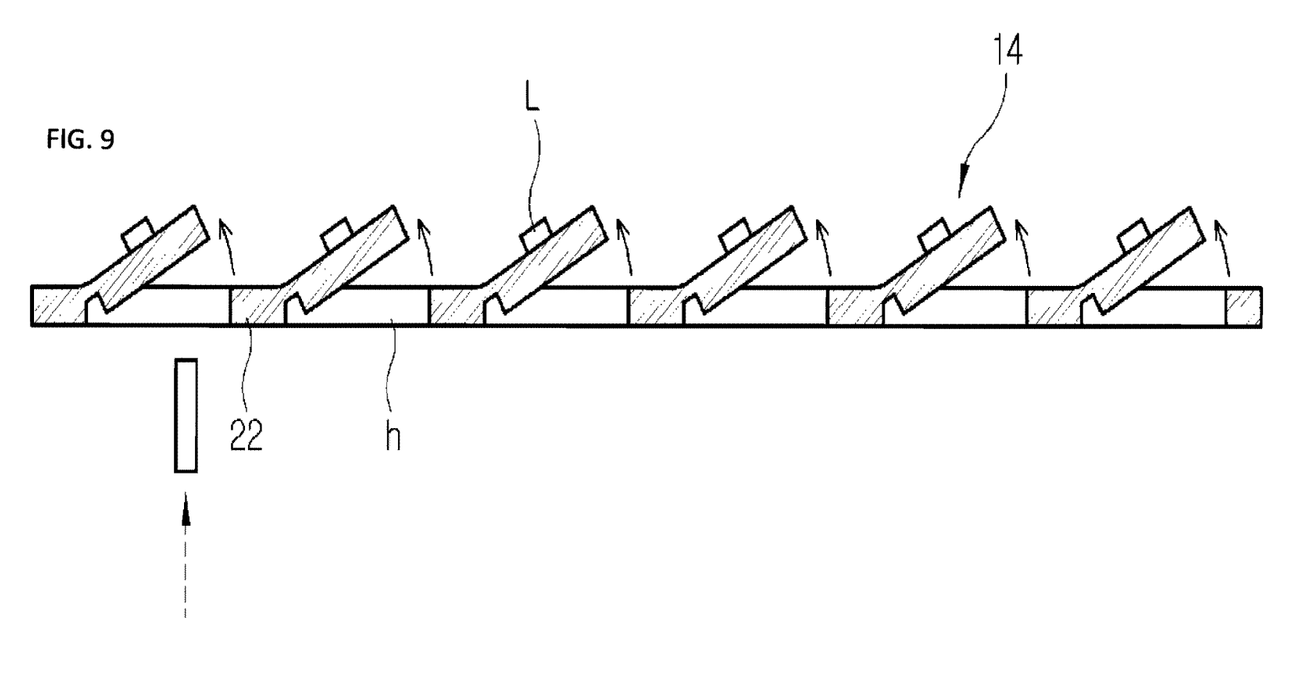
FIG. 9 is a phase diagram illustrating a procedure in which a unit pattern of the metal PCB is pushed forward to be inclined at a predetermined angle from the metal PCB.

After completing the aforementioned steps, a unit pattern bending step S130 is performed. In step S130, the unit pattern 16 of the metal PCB 14 is protruded from the metal PCB 14.

That is, three surfaces 20a, 20b, 20c of the unit pattern 16 which surrounds the unit pattern 16 are cut while the bending groove 24 is formed on the rest one surface 20d, and the unit pattern 16 is pushed upwards from below the metal PCB 14 by using a tool.

In the meantime, since the rest one surface 20d of the unit pattern 16 is connected to the metal PCB 14 in one entity while the other three surfaces 20a, 20b, 20c are cut from the metal PCB 14, the unit pattern 16 is not completely removed from the metal PCB 14, and it is pushed while one side is connected to the metal PCB 14, which results in the unit pattern 16 which is bent from the metal PCB 14 at a predetermined angle.

Also, since the bending groove 24 is formed on the bottom surface of the metal PCB 14 and the bending of the unit pattern 16 begins at the bending groove 24, the unit pattern 16 can be bent using a smaller force.

In the meantime, a through-hole h, which passes through the metal PCB 14, is formed at a region where the unit pattern 16 used to exist before it is pushed forward.

Figure 10:
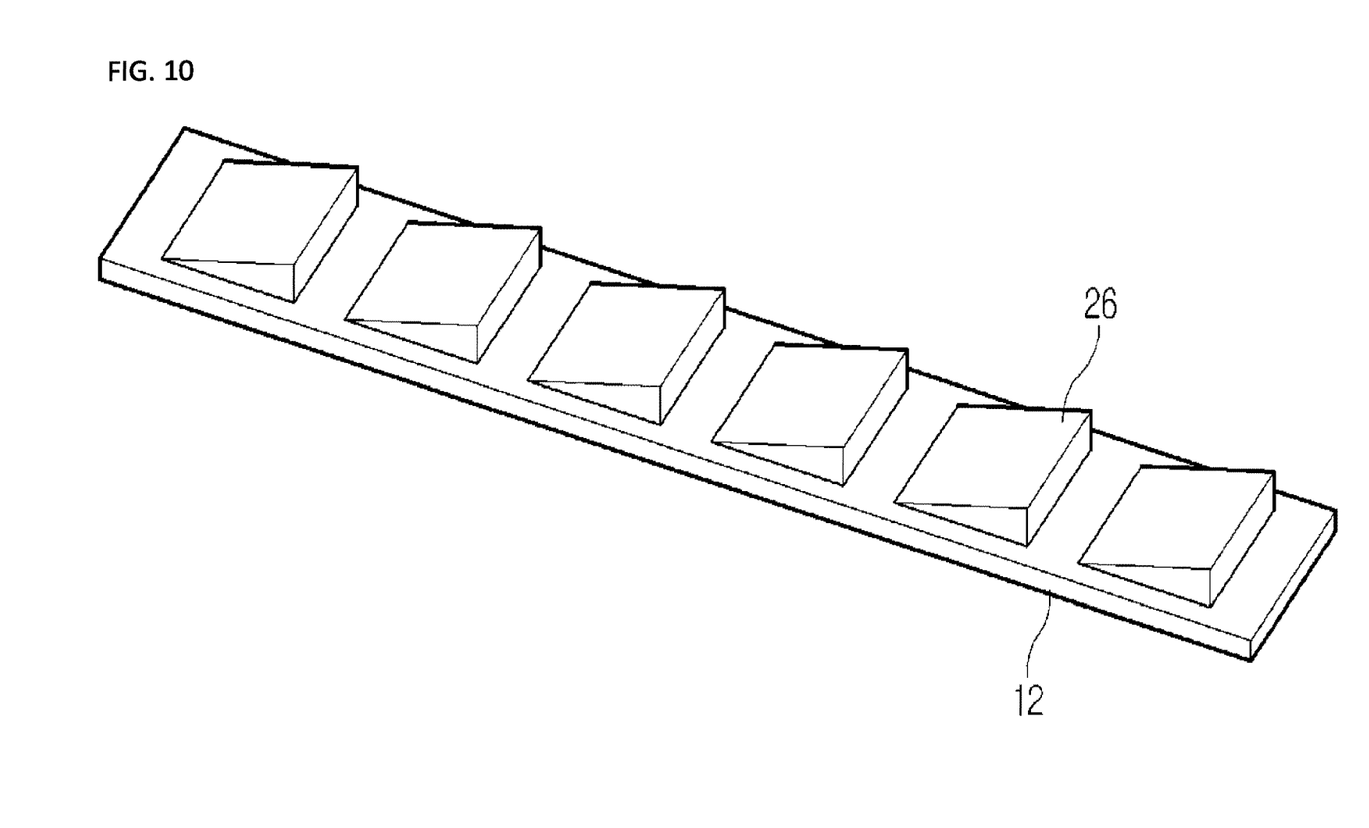
FIG. 10 is a perspective view illustrating an injection molded product which is coupled with the metal PCB shown in FIG. 9.

After these operations are completed, a step S140 for coupling the metal PCB 14 with the injection molded product 12 is performed.

In step S140, the injection molded product 12 includes injection molded products 12 made of various materials, and, for example, it can be a plastic injection molded product 12.

This injection molded product 12 includes a flat type base 25 and a plurality of support portions 26 which are protruded from the base 25 to support a lower portion of the unit pattern 16, such that the unit pattern 16 maintains an inclined shape.

Figure 11:
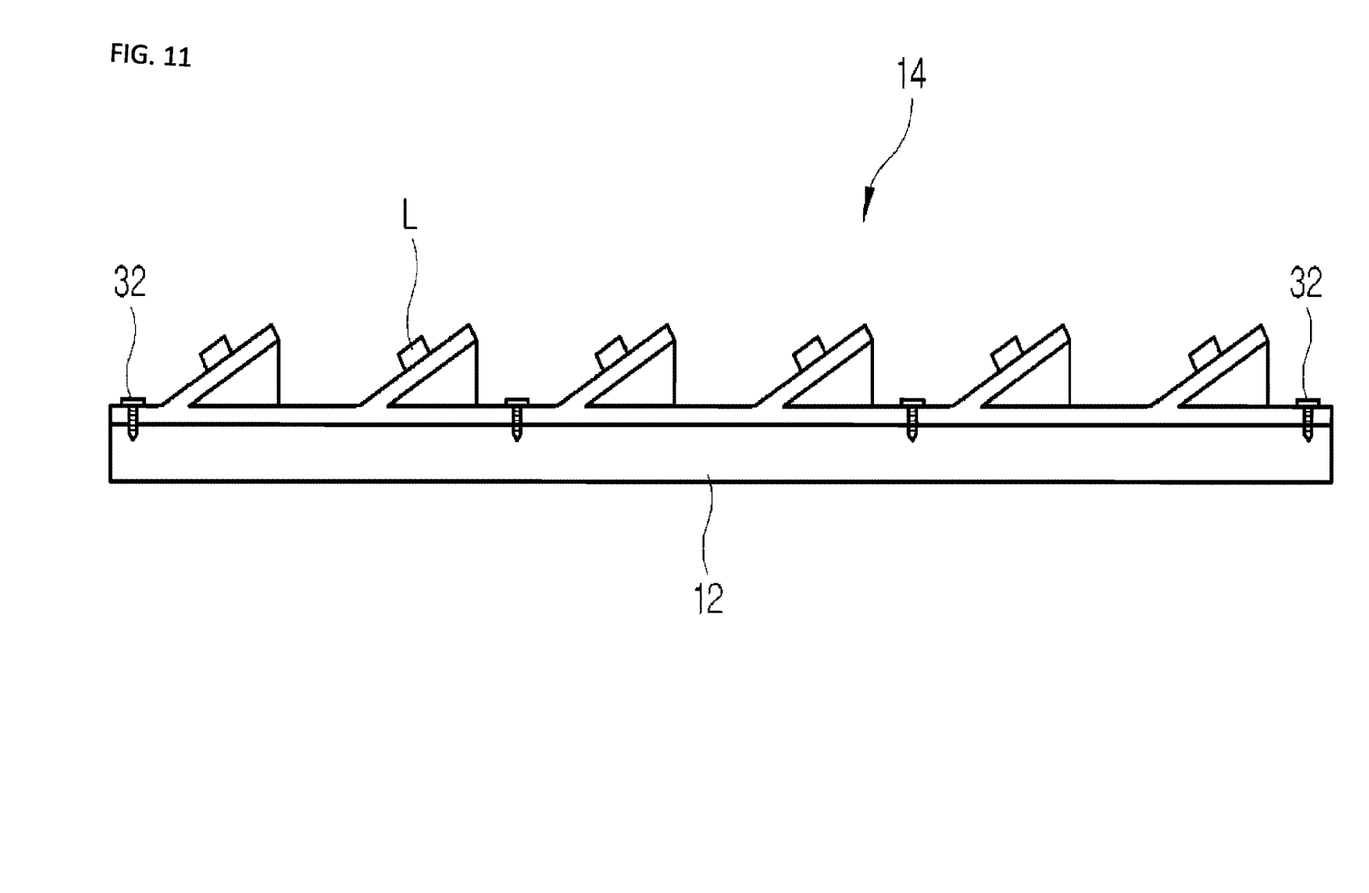
FIG. 11 is a side view illustrating a shape of the metal PCB coupled with the stepwise injection molded product.

Therefore, while the injection molded product 12 is coupled with the metal PCB 14, the support portions 26 pass through the through-hole h of the metal PCB 14 to contact the bottom surface of the unit pattern 16 and support them.

Then, the metal PCB 14 is fixed on the injection molded product 12 in one entity by using a coupling member 32 such as a screw.

By using the aforementioned processes, a plurality of unit patterns 16 are protruded from the metal PCB 14 to be inclined thereto and are supported by the injection molded products 12. Therefore, the light emitted from LEDs L of each of the unit patterns 16 can be emitted forward at a predetermined angle.

INDUSTRIAL APPLICABILITY

The present invention relates to a technology which cuts three side surfaces of a unit pattern arranged on a metal circuit board and forms a bending groove on a rear surface of the circuit board, which corresponds to one rest side surface, such that the unit pattern is easily bent forward at a predetermined angle from the metal circuit board and the LED light is emitted forward, and, therefore, it can be applied to a field of a vehicle lamp.

The invention claimed is:

1. A manufacturing method of a metal printed circuit board (PCB) assembly comprising:
   preparing a material of a metal PCB;
   forming and cutting a circuit pattern and a plurality of unit patterns from the material of a metal PCB to form a metal PCB;
   forming a bending groove on a bottom surface of the metal PCB;
   protruding each of the plurality of unit patterns forward around the bending groove of the metal PCB such that each of the unit patterns is bent to be inclined from the metal PCB; and
   coupling a stepwise injection molded product with the metal PCB while the plurality of unit patterns is protruded,
   wherein in forming and cutting the metal PCB, when separating the metal PCB from a metal copper clad laminate (MCCL) by cutting the material using a press tool, three outer surfaces, which surround the unit pattern of the metal PCB are cut,
   wherein upon bending the plurality of unit patterns, when each of the plurality of unit patterns is pushed and pressurized from behind the metal PCB, each of the plurality of unit patterns is protruded forward while regarding the bending groove as a start point, such that each of the plurality of unit patterns is inclined forward at a predetermined angle with respect to the metal PCB, and
   wherein upon coupling the injection molded product with the metal PCB, the injection molded product is coupled with a rear surface of the metal PCB, wherein the injection molded product includes a flat type base and a plurality of support portions which are protruded from the flat type base to support a lower portion of the plurality of unit patterns, such that the plurality of unit patterns maintains an inclined shape.

2. The manufacturing method of a metal PCB assembly according to claim 1, wherein in forming the bending groove, the bending groove is machined on the bottom surface of the metal PCB, which correspond to the one rest surface except for the three cut surfaces of four outer side surfaces of the plurality of unit patterns, in a width direction to a predetermined depth.

* * * * *